(12) United States Patent
Dell et al.

(10) Patent No.: US 8,245,105 B2
(45) Date of Patent: Aug. 14, 2012

(54) CASCADE INTERCONNECT MEMORY SYSTEM WITH ENHANCED RELIABILITY

(75) Inventors: Timothy J. Dell, Colchester, VT (US); Kevin C. Gower, LaGrangeville, NY (US); Warren E. Maule, Cedar Park, TX (US); Michael R. Trombley, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 1078 days.

(21) Appl. No.: 12/166,235

(22) Filed: Jul. 1, 2008

(65) Prior Publication Data
US 2010/0005366 A1 Jan. 7, 2010

(51) Int. Cl.
*H03M 13/00* (2006.01)
(52) U.S. Cl. ...................................... 714/758
(58) Field of Classification Search .................. 714/758
See application file for complete search history.

(56) References Cited

U.S. PATENT DOCUMENTS

| | | | |
|---|---|---|---|
| 4,034,195 A | 7/1977 | Bates | |
| 4,376,306 A | 3/1983 | Giusto | |
| 4,468,770 A | 8/1984 | Metcalf et al. | |
| 4,631,686 A | 12/1986 | Ikawa et al. | |
| 4,644,498 A | 2/1987 | Bedard et al. | |
| 4,775,979 A | 10/1988 | Oka | |
| 5,321,813 A | 6/1994 | McMillen et al. | |
| 5,513,135 A | 4/1996 | Dell et al. | |
| 6,067,262 A | 5/2000 | Irrinki et al. | |
| 6,070,256 A | 5/2000 | Wu et al. | |
| 6,119,181 A | 9/2000 | Vorbach et al. | |
| 6,147,967 A | 11/2000 | Ying et al. | |
| 6,297,995 B1 | 10/2001 | McConnell et al. | |
| 6,308,286 B1 | 10/2001 | Richmond et al. | |
| 6,337,817 B1 | 1/2002 | Horiguchi et al. | |
| 6,338,154 B2 | 1/2002 | Kim | |
| 6,367,042 B1 | 4/2002 | Phan et al. | |
| 6,381,685 B2 | 4/2002 | Dell et al. | |

(Continued)

FOREIGN PATENT DOCUMENTS

EP 1622020 A2 2/2006

(Continued)

OTHER PUBLICATIONS

G. Boudon et al., "Novel Bus Reconfiguration Scheme With Spare Lines", IBM Technical Bulletin, May 1987, pp. 5590-5593.

(Continued)

*Primary Examiner* — Scott Baderman
*Assistant Examiner* — Enam Ahmed
(74) *Attorney, Agent, or Firm* — Cantor Colburn LLP

(57) ABSTRACT

A hub device, memory system, and method for providing a cascade interconnect memory system with enhanced reliability. The hub device includes an interface to a high-speed bus for communicating with a memory controller. The memory controller and the hub device are included in a cascade interconnect memory system and the high-speed bus includes bit lanes and one or more clock lanes. The hub device also includes a bi-directional fault signal line in communication with the memory controller and readable by a service interface. The hub device also includes a fault isolation register (FIR) for storing information about failures detected at the hub device, the information including severity levels of the detected failures. In addition, the hub device includes error recovery logic for responding to a failure detected at the hub device.

18 Claims, 8 Drawing Sheets

U.S. PATENT DOCUMENTS

| | | |
|---|---|---|
| 6,518,593 B2 | 2/2003 | Takabayashi et al. |
| 6,526,461 B1 | 2/2003 | Cliff |
| 6,531,339 B2 | 3/2003 | King et al. |
| 6,789,212 B1 | 9/2004 | Klingman |
| 6,895,528 B2 | 5/2005 | Cantwell et al. |
| 6,931,564 B2 | 8/2005 | Goodman et al. |
| 6,973,605 B1 | 12/2005 | Templeton et al. |
| 7,013,416 B2 | 3/2006 | Whetsel |
| 7,058,918 B2 | 6/2006 | Abramovici et al. |
| 7,069,494 B2 | 6/2006 | Cargnoni et al. |
| 7,154,723 B1 | 12/2006 | Warnakulasooriya et al. |
| 7,168,005 B2 | 1/2007 | Adams et al. |
| 7,178,076 B1 | 2/2007 | Zarrineh et al. |
| 7,181,659 B2 | 2/2007 | Bravo et al. |
| 7,277,346 B1 | 10/2007 | Rahim et al. |
| 7,299,313 B2 | 11/2007 | Gower et al. |
| 7,334,149 B1 | 2/2008 | Wu |
| 7,353,316 B2 | 4/2008 | Erdmann |
| 7,362,697 B2 | 4/2008 | Becker et al. |
| 7,954,038 B2 * | 5/2011 | Racunas et al. ............... 714/763 |
| 2002/0024455 A1 | 2/2002 | Abbiate et al. |
| 2002/0075982 A1 | 6/2002 | Doblar |
| 2003/0074619 A1 | 4/2003 | Dorsey |
| 2003/0185251 A1 | 10/2003 | Ichino et al. |
| 2004/0180455 A1 | 9/2004 | Marr |
| 2004/0190331 A1 | 9/2004 | Ross et al. |
| 2004/0216026 A1 | 10/2004 | Ferraiolo et al. |
| 2004/0250181 A1 | 12/2004 | Vogt et al. |
| 2005/0138496 A1 | 6/2005 | Brennan et al. |
| 2005/0174138 A1 | 8/2005 | Marr |
| 2005/0210185 A1 | 9/2005 | Renick |
| 2005/0223196 A1 | 10/2005 | Knowles |
| 2005/0246597 A1 | 11/2005 | Whetsel |
| 2006/0036827 A1 | 2/2006 | Dell et al. |
| 2006/0095620 A1 | 5/2006 | Dreps et al. |
| 2006/0107175 A1 | 5/2006 | Dell et al. |
| 2006/0179369 A1 | 8/2006 | Bravo et al. |
| 2006/0179394 A1 | 8/2006 | O'Neill et al. |
| 2006/0218455 A1 | 9/2006 | LeClair et al. |
| 2006/0277363 A1 | 12/2006 | Qiu et al. |
| 2007/0011562 A1 * | 1/2007 | Alexander et al. ............ 714/758 |
| 2007/0075734 A1 | 4/2007 | Ramos et al. |
| 2007/0204190 A1 | 8/2007 | Hesse et al. |
| 2007/0226579 A1 * | 9/2007 | Alexander et al. ............ 714/758 |
| 2007/0283223 A1 | 12/2007 | Dell et al. |
| 2007/0288816 A1 | 12/2007 | Nakanishi |
| 2007/0300129 A1 | 12/2007 | Dell et al. |
| 2008/0005644 A1 | 1/2008 | Dell |
| 2008/0022186 A1 | 1/2008 | Co et al. |
| 2008/0028345 A1 | 1/2008 | Suri et al. |
| 2008/0046774 A1 | 2/2008 | Hirai et al. |
| 2008/0046796 A1 | 2/2008 | Dell et al. |
| 2008/0065938 A1 | 3/2008 | Cowell et al. |
| 2008/0115137 A1 | 5/2008 | Gower et al. |

FOREIGN PATENT DOCUMENTS

| | | |
|---|---|---|
| JP | 02-307254 | 12/1990 |
| JP | 03-234125 | 10/1991 |
| JP | 09-261210 | 10/1997 |

OTHER PUBLICATIONS

Sunggu Lee, et al., "Probabilistic Diagnosis of Multiprocessor Systems", ACM Computing Surveys, Mar. 1994, pp. 121-139, vol. 26, No. 1.

Alan Charlesworth et al., "The Starfire SMP Interconnect", 1997, pp. 1-20, ACM.

Daniele Rossi et al., "New ECC for Crosstalk Impact Minimization", Jul./Aug. 2005, pp. 340-348 IEEE CS and the IEEE CASS.

Smitha Shyam et al., "Ultra Low-Cost Defect Protection for Microprocessor Pipelines", ASPLOS' 06, Oct. 21-25, 2006, pp. 73-82, ACM, San Jose, California, USA.

D.M Berger et al., "High-Speed source-synchronous interface for the IBM Sysytem z9 processor" IBM J. RES & DEV., Jan. 2007, pp. 53-64, vol. 51, No. 1/2, IBM.

FBDIMM: Architecture and Protocal, Jan. 2007, JESD206, JEDEC Solid State Technology Association, Arlington, VA USA.

* cited by examiner

| Error Type | SN FIR | SN Action | Host Action | Service Element Actions | CE Actions | Result |
|---|---|---|---|---|---|---|
| ZEs | Information | None | None | Log error during next scheduled fail data collection operation | None | Error ignored. |
| Temporary soft CEs | Information | None | At CE threshold, execute error recovery operation, (ERO). | Log retry based on host request for attention | None | Error self-healed. Retry successful. |
| Persistent soft CEs | Information | None | At CE threshold execute ERO. | Log re-initialization baed on host request for attention | None | Initial retry fails. Error healed by re-initialization. Second retry successful. |
| Hard CEs | Information | None | At first CE threshold, execute ERO, at second execute SDRAM sparing. | Log SDRAM sparing based on host request for attention | None | Retry, re-init and repair fails to correct CEs. Host initiated SDRAM sparing/marking repairs failure. |
| Temporary soft UEs | Information | Enter error recovery state, (ERS) | Execute ERO. | Log retry based on host request for attention | None | Error self-healed. Retry successful. |
| Persistent soft UEs | Information | Enter ERS | Execute ERO. | Log re-initialization based on host request for attention | None | Initital retry fails. Error healed by re-initialization. Second retry successful. |
| Repairable hard UEs | Information | Enter ERS | Execute ERO. | Log repair based on host request for attention. | None | Initital retry fails. Error healed by repair. Second retry successful. |
| Un-repairable UE | Information | Enter ERS | Attempt ERO. Upon failure, mask SN ERS for this detector. | Call home for repair based on host request for attention. | Replace FRU | Retry and repair fails. Count on ECC to protect against DI until HW replacement. |

FIG. 7

CASCADE INTERCONNECT MEMORY SYSTEM WITH ENHANCED RELIABILITY

This invention was made with Government support under Agreement No. HR0011-07-9-0002 awarded by DARPA. The Government has certain rights in the invention.

BACKGROUND

This invention relates generally to computer memory systems, and more particularly to a cascade interconnect memory system with enhanced reliability.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

SUMMARY

An exemplary embodiment is a hub device including an interface to a high-speed bus for communicating with a memory controller. The memory controller and the hub device are included in a cascade interconnect memory system and the high-speed bus includes bit lanes and one or more clock lanes. The hub device also includes a bi-directional fault signal line in communication with the memory controller and readable by a service interface. The hub device also includes a fault isolation register (FIR) for storing information about failures detected at the hub device, the information including severity levels of the detected failures. In addition, the hub device includes error recovery logic for responding to a failure detected at the hub device. Responding to the error includes recording a severity level of the failure in the FIR and taking an action at the hub device that is responsive to the severity level of the failure. The action includes one or more of fast clock stop, setting the bi-directional fault indicator, setting cyclical redundancy code (CRC) bits and transmitting them to the memory controller, re-try, sparing out a bit lane and sparing out a clock lane.

Another exemplary embodiment is a high reliability cascade interconnect memory system including a memory controller and a unidirectional downstream channel including multiple bit lanes and clock lanes, the downstream channel in communication with the memory controller and operable for transferring data frames comprised of eight, twelve or sixteen transfers. The memory system also includes a unidirectional upstream channel including multiple bit lanes and clock lanes, the downstream channel in communication with the memory controller and operable for transferring data frames comprised of eight transfers. In addition, the memory system includes a hub device in communication with a plurality of memory devices and in communication with both the downstream and upstream channels for communicating with the memory controller via direct connection or via a cascade interconnection through another hub device. The hub device includes a bi-directional fault signal line in communication with the memory controller and readable by a service interface, and a FIR for storing information about failures detected at the hub device. The information stored in the FIR includes severity levels of the detected failures. In addition, the hub device includes error recovery logic for responding to a failure detected at the hub device. Responding to the failure includes recording a severity level of the failure in the FIR, and taking an action at the hub device that is responsive to the severity level of the failure. The action includes one or more of fast clock stop, setting the bi-directional fault indicator, setting cyclical redundancy code (CRC) bits and transmitting them to the memory controller, re-try, sparing out a bit lane and sparing out a clock lane.

A further exemplary embodiment is a method for processing errors in a memory system. The method includes detecting a failure having a severity level at a hub device in a cascade interconnect memory system. The memory system includes the hub device and a memory controller. The method also includes recording the severity level in a FIR at the hub device. In response to the severity level being equal to fault, the hub device notifies the memory controller of the failure via a fault signal line, preserves contents of internal latches and memory devices in response to the hub device operating in a slow clock mode, and asserts fences and turns off logical clocks at the hub device. In response to the severity level being equal to recoverable, the hub device notifies the memory controller of the failure by transmitting a poisoned cyclical redundancy code (CRC) to the memory controller, and preserves contents of internal latches and memory devices. In response to the severity level being equal to attention, the hub device records the failure at the memory device in response to the severity level being equal to attention.

A still further embodiment is a design structure tangibly embodied in a machine readable medium for designing, manufacturing, or testing an integrated circuit. The design structure includes a hub device that includes an interface to a high-speed bus for communicating with a memory controller. The memory controller and the hub device are included in a cascade interconnect memory system and the high-speed bus includes bit lanes and one or more clock lanes. The hub device also includes a bi-directional fault signal line in communication with the memory controller and readable by a service interface. The hub device also includes a fault isolation register (FIR) for storing information about failures detected at the hub device, the information including severity levels of the detected failures. In addition, the hub device includes error recovery logic for responding to a failure detected at the hub device. Responding to the error includes recording a severity level of the failure in the FIR and taking an action at the hub device that is responsive to the severity level of the failure. The action includes one or more of fast clock stop, setting the bi-directional fault indicator, setting cyclical redundancy code (CRC) bits and transmitting them to the memory controller, re-try, sparing out a bit lane and sparing out a clock lane.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES:

FIG. 7 is a table indicating expected results from various error recovery scenarios that may be implemented by an exemplary embodiment of the present invention.

DETAILED DESCRIPTION

An exemplary embodiment of the present invention provides fault detection and correction in a memory system. The fault detection and correction is provided with the effectiveness of an error correcting code (ECC) solution and the efficiency of a cyclical redundancy code (CRC) solution, with the added benefit of clock protection. High-speed buses to the main memory of a computer or communications system have many opportunities for the data they carry to be corrupted by such diverse phenomena as power supply noise, electromagnetic noise (EMC), clock jitter, silicon defects, mechanical errors, mismatched thermal coefficients of expansion, etc. In addressing ways to minimize corrupted data in a computer system and to maximize system availability, memory system designers generally have to select between implementing an ECC and a CRC solution. The ECC solution provides robust error detection and correction but with a system overhead cost, while the CRC solution provides an efficient manner of detecting errors but has limited or no error correction. An exemplary embodiment of the present invention moves the state of the art of the reliability of a cascaded interconnect memory subsystem considerably forward by providing the effectiveness of an ECC solution with the efficiency of a CRC solution.

An exemplary embodiment of the present invention includes a cascaded memory subsystem with a configurable fast clock stop on fault, a bi-directional fault indicator that can be polled by service and controller interfaces, CRC, re-try, two sets of dedicated spare lanes (differential pairs), ability to spare out the clock, a redundant fault indicator, a dual in-line memory module (DIMM) reset pin, primary field service interface (FSI) clock/data pins, secondary FSI clock/data pins, and lane shadowing. Thus, in an exemplary embodiment, a very broad range of defects and failure modes are protected in an efficient and robust manner, including clock faults.

Figure 1:
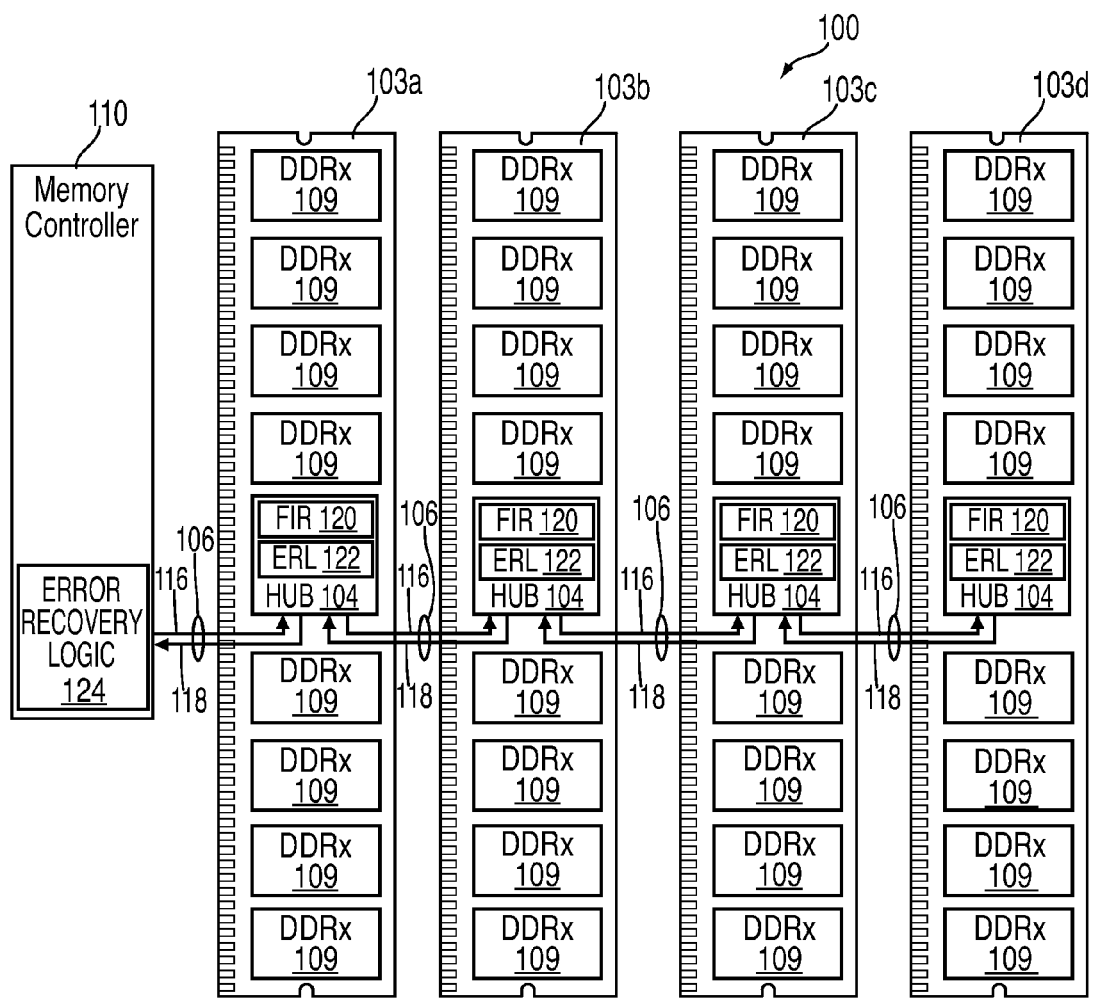
FIG. 1 depicts a cascade interconnect memory system that may be implemented by an exemplary embodiment.

Turning now to FIG. 1, an example of a memory system 100 that includes fully buffered DIMMs communicating via a high-speed channel and using the specialized bus CRC described herein. The memory system 100 may be incorporated in a host processing system as main memory for the processing system. The memory system 100 includes a number of DIMMs 103a, 103b, 103c and 103d with memory hub devices 104 communicating via a channel 106 or a cascade-interconnected bus (made up of a differential unidirectional upstream bus 118 and a differential unidirectional downstream bus 116). The DIMMs 103a-103d can include multiple memory devices 109, which may be double data rate (DDR) dynamic random access memory (DRAM) devices, as well as other components known in the art, e.g., resistors, capacitors, etc. The memory devices 109 are also referred to as DRAM 109 or DDRx 109, as any version of DDR may be included on the DIMMs 103a-103d, e.g., DDR2, DDR3, DDR4, etc. A memory controller 110 interfaces with DIMM 103a, sending commands, address and data values via the channel 106 that may target any of the DIMMs 103a-103d. The commands, address and data values may be formatted as frames and serialized for transmission at a high data rate.

In an exemplary embodiment, when a DIMM receives a frame from an upstream DIMM or the memory controller 110, it redrives the frame to the next DIMM in the daisy chain (e.g., DIMM 103a redrives to DIMM 103b, DIMM 103b redrives to DIMM 103c, etc.). At the same time, the DIMM decodes the frame to determine the contents. Thus, the redrive and command decode at a DIMM can occur in parallel, or nearly in parallel. If the command is a read request, all DIMMS 103a-103d and the memory controller 110 utilize contents of the command to keep track of read data traffic on the upstream bus 118.

The hub devices 104 on the DIMMs receive commands via a bus interface (e.g. a port) to the channel 106. The bus interface on the hub device 104 includes, among other components, a receiver and a transmitter. In an exemplary embodiment, a hub device 104 includes both an upstream bus interface for communicating with an upstream hub device 104 or memory controller 110 via the channel 106 and a downstream bus interface for communicating with a downstream hub device 104 via the channel 106.

Although only a single memory channel 106 is shown in FIG. 1 connecting the memory controller 110 to a single memory device hub 104, systems produced with these modules may include more than one discrete memory channel from the memory controller, with each of the memory channels operated singly (when a single channel is populated with modules) or in parallel (when two or more channels are populated with modules) to achieve the desired system functionality and/or performance. Moreover, any number of lanes can be included in the channel 106. For example, the downstream bus 116 can include 13 bit lanes, 2 spare lanes and a clock lane, while the upstream bus 118 may include 20 bit lanes, 2 spare lanes and a clock lane.

Figure 5:
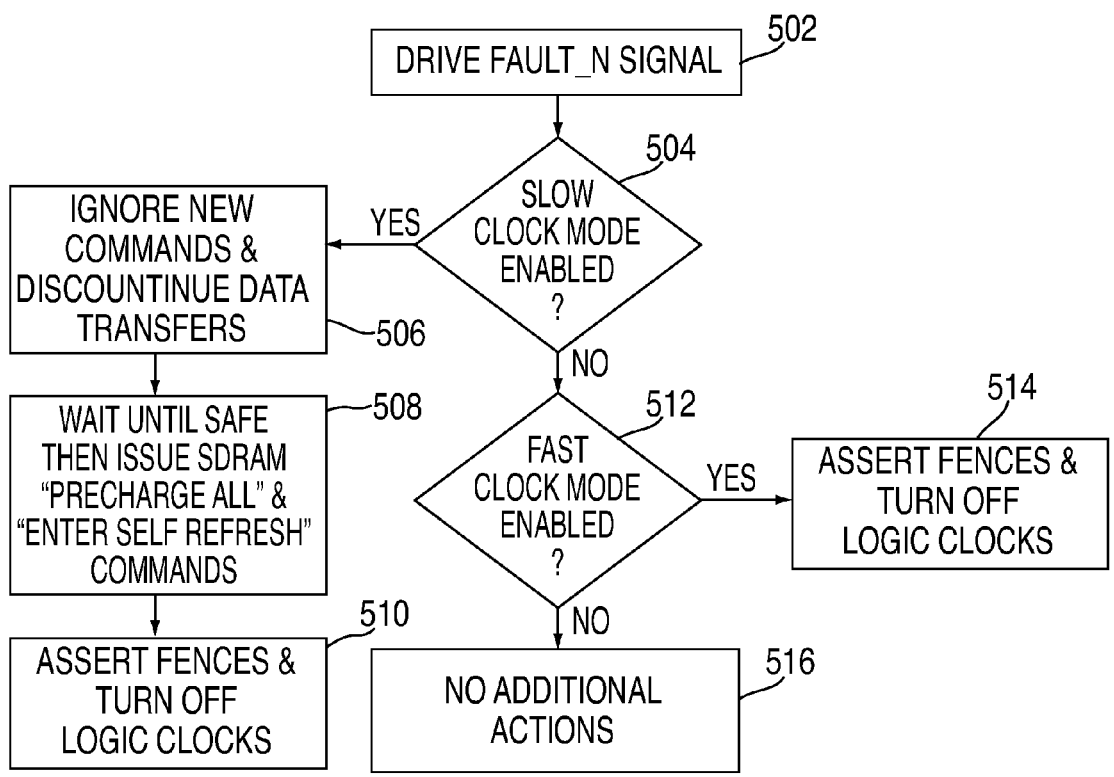
FIG. 5 depicts hub device fault error severity processing that may be implemented by an exemplary embodiment.
Figure 6:
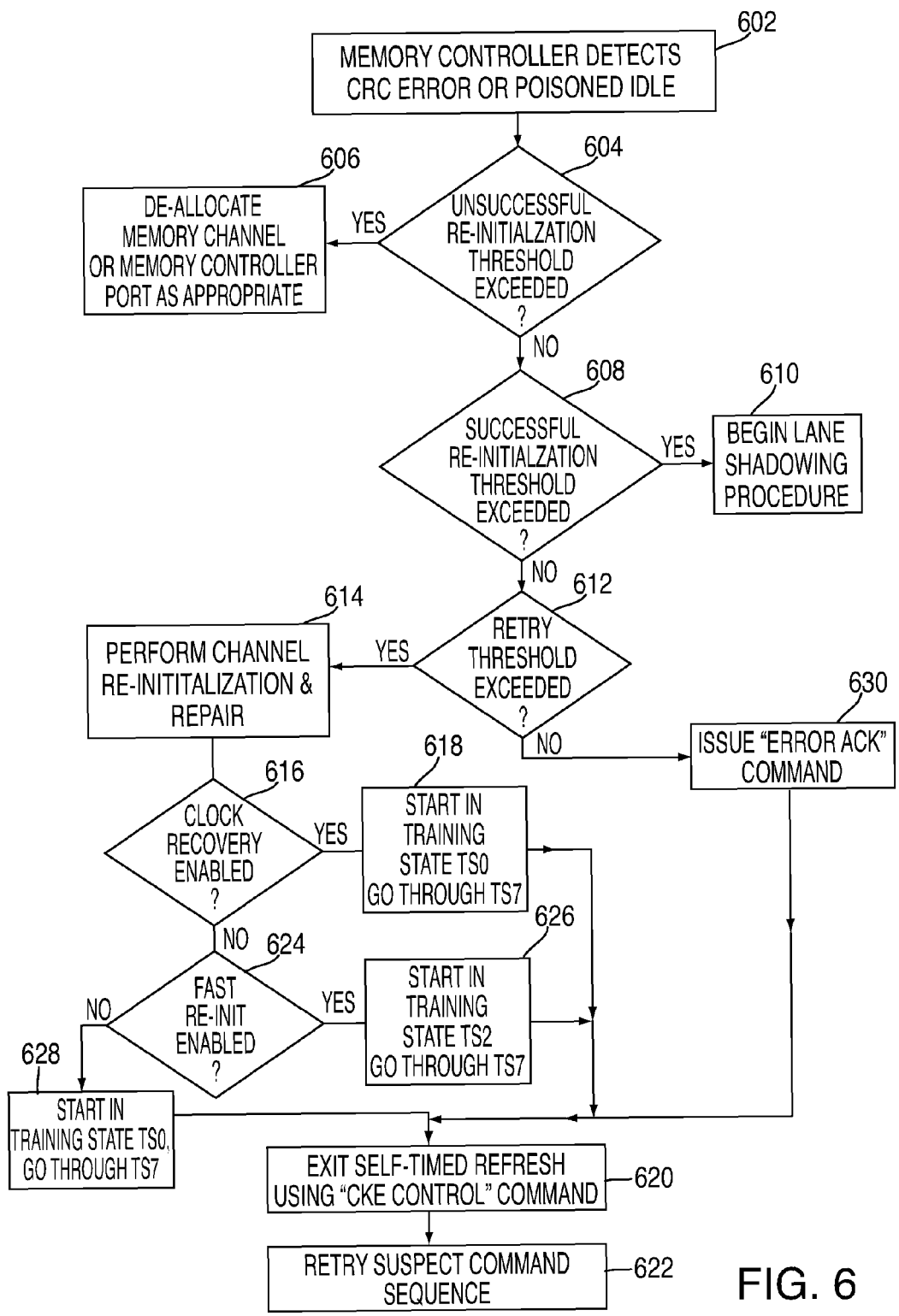
FIG. 6 depicts a memory controller error recovery operation process flow that may be implemented by an exemplary embodiment of the present invention.

In an exemplary embodiment, the memory controller 110 includes error recovery logic 124 as described herein, for example in reference to FIG. 6. In addition, the hub devices 104 include error recovery logic 122 as described herein, for example in reference to FIGS. 3-5, as well as one or more fault isolation registers 120 (FIRs). A FIR is an architected means of storing information about a failure that is detected within a hub device 104. The FIR 120 can be interrogated by the memory controller 110 and/or system to determine what action(s), if any, need to be performed.

Figure 2:
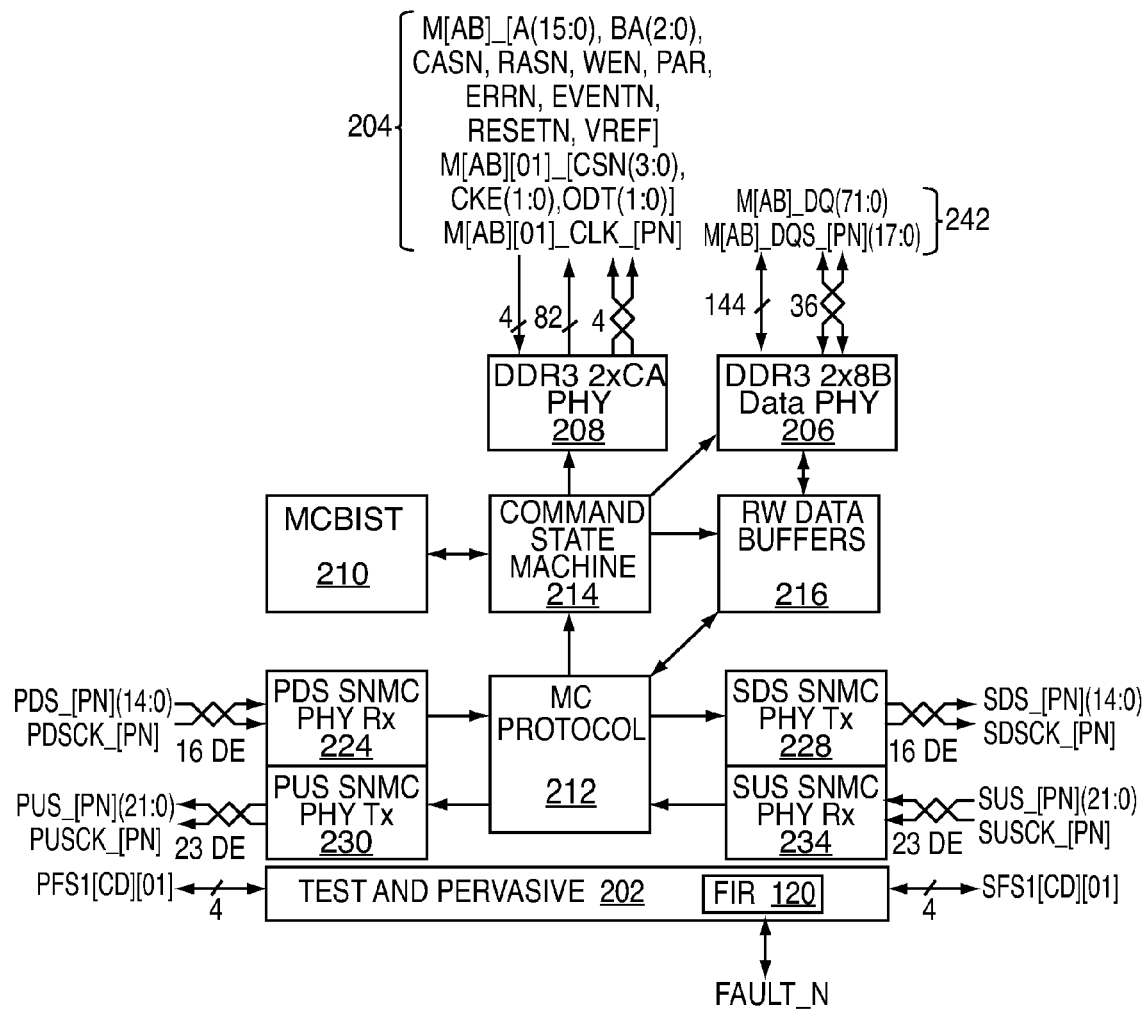
FIG. 2 is a block diagram of a high-level logic flow of a hub device that may be implemented by an exemplary embodiment.

FIG. 2 is a block diagram of the high-level logic flow of a hub device that may be implemented by an exemplary embodiment. The blocks in the lower left and right portions of the drawing (224, 230, 228, 234) are associated with receiving or driving a high-speed bus including the high speed unidirectional upstream and downstream buses previously referenced. "Upstream" refers to the one or more bus(es) passing information to and/or from the hub device in the direction of the memory controller, and "downstream" refers to the bus(es) passing information from the hub device to and/or from the modules and/or buffers located further away from the memory controller.

Referring to FIG. 2, data, command, address, error detection information (e.g. ECC bits and/or CRC bits), and clock signals from an upstream memory module or memory controller are received (in the exemplary embodiment, in the form of data packets), from the high speed cascade interconnect downstream (e.g. the "primary downstream" (PDS)) memory bus into a receiver functional block 224. The receiver functional block 224 includes receiver and re-sync circuitry and other support logic to enable the capturing of information from an upstream device, as well as bitlane sparing circuitry to enable the replacement of one or more defective data and/or clock differential pairs between the receiving device and the sending device (e.g. one or more segments comprising a part of the cascade interconnect channel). In the exemplary embodiment, the sparing circuitry exists in each of the driver and receiver functional blocks (224, 230, 228 and 234), as well as in the memory controller, and permits any one or more of the differential pairs between any two devices on the memory bus to be replaced by an unused and/or underutilized ("spare") differential signal pair—retaining full function and failure coverage on the affected bus—thereby resulting in improved product long-term memory system reliability and usability given the ability to continue normal operation of the memory system independent of one or more faults resident in one or more segments of the one or more memory system bus(es) which further operate together to comprise the memory controller channel(s).

An exemplary embodiment of the downstream memory bus further enables operation of a sixteen bit, high-speed fully differential, slave receiver bus further including one or more (e.g.) differential spare bitlane(s). In an exemplary embodiment, the receiver functional block 224 transmits the received signals to a memory controller (MC) protocol functional block 212 which both passes the received signals to driver functional block 228 (e.g. secondary downstream (SDS) driver functional block) for re-driving the received and/or re-synchronized signals (e.g. data packet(s)) to a downstream memory buffer and/or buffered memory module, as well as captures the received packet(s) and forwards the data included in the packet(s), in a memory module format and at a memory module data rate to command state machine functional block 214 (e.g. address, command and control information) and read/write data buffers 216 (e.g. data to be written to the memory device(s), generally also including memory date ECC "check" bits). In an exemplary embodiment, MC protocol functional block 212 further includes circuitry to validate the received data prior to and/or after re-driving the received data, e.g. using ECC and/or CRC bits included in the memory packet, enabling the hub to identify and report faults present in the received data since being sent by the transmitting device.

In other exemplary embodiments the hub device circuitry (e.g one or both of blocks 212 and 214) may first determine if the information is intended solely for use by that hub and/or module, negating the need to pass the information to the driver functional block 228 with the accompanying power utilization by that block. The driver functional block 228 provides circuitry (often embodied in the form of logic macros) macros and support logic for the downstream memory bus. As described above, the MC protocol functional block 212 may perform numerous functions, including, but not limited to: segment level sparing to replace one or more defective segments (e.g., differential wires between two memory modules or between a memory module and a memory controller) with one of the spare segments; error detection circuitry; error reporting circuitry; packet capture and data extraction from the packet; and the merging of local data onto the downstream and/or upstream cascade interconnect bus(es), etc. In an exemplary embodiment the ERL 122 and FIR 120 as described herein are located within the MC protocol functional block 212. In another embodiment, the FIR 120 is located in the test and pervasive block 202. Although not shown in FIG. 2, in an exemplary embodiment, the FIR is in communication with every block shown in FIG. 2 so that the FIRs can monitor error checkers all over the hub device (and outside, in the case of the thermal sensors).

In an exemplary embodiment, the command state machine functional block 214 determines if the signals (which will generally include one or more of data, command, control and address signals) are directed to and should be processed by the current memory module where the hub device is located. If the signals are directed to the current memory module, then the command state machine functional block 214 determines what actions to take (e.g. by decoding the one or more commands which may be included in the packet) and may initiate memory device actions, write buffer actions, read buffer actions, internal hub actions (e.g. MCBIST) or a combination thereof. In the exemplary embodiment, depending on the type of memory module, the command state machine functional block 214 selects the appropriate drive characteristics, timings and timing relationships based on register settings established during initialization and/or periodic operational evaluation of the memory device interface. In an exemplary embodiment, the MC protocol functional block 212 provides the conversion between signals received via the high speed bus in a packetized memory interface format into a memory module data rate, currently a non-packetized memory module interface format although the memory devices may operate using a device-specific packetized interface in future embodiments, necessitating conversion to that interface.

The read/write data buffers 216 transmit the data (e.g. the information to be written to the memory device(s)) to a memory data interface block 206 and the command state machine functional block 214 transmits the associated addresses, control and command signals to a memory command interface block 208, with the signals consistent with the memory device specification in the exemplary embodiment. The memory command interface functional block 208 transmits the associated addresses, control and command signals 204 to a memory device via an address/command bus (which includes one or more of address, control, command information and error information, as indicated in the exemplary list comprising 204). The memory data interface functional block 206 reads from and writes memory data 242 to a memory device via a data bus, and in the exemplary embodiment, further includes data strobes (e.g. "DQS" signals) to facilitate the identification and capture of data at the receiving device (the buffer and/or the memory device(s). With ever-higher speed address, control, command and data bus operation, other methods in addition to or instead of strobes will be adopted to enable the identification and capture of information at the receiving device(s).

As shown in the exemplary memory device interface located between the memory data interface functional block 206 and the signals listed in 242, two copies of the memory interface information (such as address, control, command, data, error detection bits, etc) required to enable independent operation of a memory port are included on the hub device. In memory data interface functional block 206, 144 data signals are shown, with 72 data signals utilized for each read and/or write port. In addition, 36 DQS (strobe) differential signals are shown, with 18 intended for communication with the 72 data signals (e.g. data bits) comprising each of the two read/write data ports in this embodiment. Similarly, separate copies of such information as address, control and command data are included in the interface(s) connected to the memory command interface block 208. In this exemplary embodiment, two memory ports are supported by the hub device, implemented using additional circuitry (such as drivers and/or receivers) for each of the ports, thereby enabling simultaneous and/or independent operation of the two memory ports and the memory devices attached to these ports. In the exemplary embodiment the simultaneous and/or independent operation of the ports is determined by one or more of the initialization of the hub device and/or one or more of the control and/or command information and the address information received by the hub device. The two ports, as implemented in the exemplary hub circuitry shown in FIG. 2, enable modules and/or other memory subsystems using the hub device to selectively operate as one or two memory subsystems.

Data signals to be transmitted to the memory controller may be temporarily stored in the read/write data buffers 216 after a command, such as a read command, has been executed by the memory module, consistent with the memory device 'read' timings. The read/write data buffers 216 selectively transfer the read data into the upstream and/or downstream bus(es) via the MC protocol functional block 212 and upstream and/or downstream bus driver functional block(s) 230 and 228. The driver functional blocks 230 and 228 provide macros and support logic for the upstream (and/or downstream) memory bus(es). While most operations completed in the memory module are expected to be read and/or write operations initiated by the memory controller, in the exemplary embodiment the memory controller built in self-test (MCBIST) functional block 210 may also initiate read and/or write operations to the memory device(s) attached to the present hub device and/or one or more upstream and downstream hub device(s), using the one or more memory ports on the hub device(s). Data read from the memory device(s) may be locally processed within the hub device (e.g. by the MCBIST circuitry) and/or sent upstream and/or downstream to other device(s) on the cascade interconnect bus(es) as shown in the communication paths defined by the arrows in the hub device shown in FIG. 2.

Signals such as data, ECC, CRC, clock error, and other information from the high-speed upstream memory bus are received by the hub device receiver functional block 234. In the exemplary embodiment, these signals are passed upstream to the next memory module or to the memory controller, although other embodiments may first decode the information to determine if the information is intended solely for use by that hub and/or module, negating the need to pass the information upstream with the accompanying power utilization. This determination may be made in relation to any upstream or downstream packet(s), thereby either preventing the re-driving of the received information (e.g. packet(s) and or allowing such re-drive, depending on the information (e.g. command and/or control) information received by the hub. In the exemplary embodiment shown in FIG. 2, such information as data, ECC, CRC, error and clock signals from a downstream memory module are received on the upstream memory bus (e.g. secondary upstream bus (SUS)) into receiver functional block 234. The receiver functional block 234 provides macros and support logic to enable the capture of information received from the upstream memory bus and in exemplary embodiments, also includes segment sparing logic as previously described. The receiver functional block 234 passes the received signals, through the MC protocol functional block 212, to the upstream memory bus via the driver functional block 230. In exemplary embodiments, the received information is also passed to the command state machine and may further pass to the MCBIST and/or R/W data buffers, depending on the contents of the information received on the bus. This operability such modes as the testing of local memory devices by an MCBIST engine in the memory system, without the direct involvement of the memory controller—thus permitting the memory controller to delegate diagnostic, test, characterization and/or other operations to the one or more hub devices on a memory channel.

As described earlier, the MCBIST functional block 210 provides built in self-test functions which act upon one or more of the local buffer, the local memory device(s) attached to the hub device, upstream memory hub device(s), upstream memory device(s), downstream hub device(s) and downstream memory device(s). In response to the built-in self test (BIST) circuitry initiating the test functions, the resulting data, error and/or other information derived from the test is analyzed by the local hub and/or the hub device initiating the test, which may be located upstream or downstream from the memory module and/or interconnections being tested. The test and pervasive functional block 202 communicates with one or more of FSI, I2C, JTAG or alternate bus types to which it is connected, providing an alternate means of communication to the memory controller and/or a service processor (the latter not shown in the figures but otherwise known in the art). The information sent and received by this block is used in exemplary embodiments for such operations as the initialization of the high speed bus(es), initialization of the hub device(s), initialization of the memory device(s) attached to the hub(s), error reporting, error recovery, diagnostic initialization, the reset of attached device(s), the programming of registers, drivers, and/or other circuitry related to the described operations, etc.

The block diagram in FIG. 2 is one implementation of a hub device that may be utilized by exemplary embodiments of the present invention. Other implementations and/or functional assignment for these and other functional blocks are possible without departing from the scope of the present invention.

An exemplary embodiment of the present invention provides a flexible set of reliability, availability and serviceability (RAS) points with respect to handling native hard and soft memory channel errors, internal logic errors, DDR3 command and address errors, thermal event errors, and DRAM data ECC accommodation. This is accomplished by the use of a combination of robust CRC checking with retry as the primary means of addressing channel soft errors, spare bit lanes as the primary means of addressing channel hard errors, error detection and correction logic for internal hub device errors, DDR3 registering clock driver parity checking for SDRAM command and address errors, thermal monitoring devices with temperature thresholds for over-temperature errors and straightforward SDRAM read and write data mapping to support host memory controller SDRAM data ECC. A configurable FIR 120 in the hub device 104 is used to record and report all errors detected. Further, an error recovery state, reported as poisoned CRC on the upstream link to the host, may be entered upon error detection in order to signal the host to initiate the on-the-fly retry, repair and error recovery operation.

Error Persistence. In an exemplary embodiment, there are three major types of error duration: temporary soft errors; persistent soft errors; and hard errors. Determining the type often requires attempting repair operations. Temporary soft errors are those in which the error condition exists for a finite amount of time and disappears of its own accord. An example of a temporary soft error is a single bit transmission error on the high speed memory channel. Persistent soft errors are those that remain until repaired. They can be fixed logically, i.e., they do not require new hardware to be invoked. Hard errors are those that can only be repaired using logically selectable spare hardware or field replaceable unit FRU hardware.

Error Effect. Generally, the extent of all errors can be described in terms of the effect on main memory data contents. Errors that affect an unused portion of the main memory subsystem will cause no memory data degradation. These types of errors are referred to herein as "data zero errors" or "ZEs." They can usually be ignored but should be recorded for informational purposes. Errors that cause memory failures limited to the number of correctable symbols in the host memory controller's data ECC word will be corrected on-the-fly without repair or retry. These are referred to herein as "data correctable errors" or "CEs." If the errors are persistent, the host data CE threshold logic may invoke a spare SDRAM lane or invoke re-initialization. Errors that result in multi-symbol memory data failures that exceed the number of correctable symbols are referred to herein as "data uncorrectable errors" or "UEs." Errors that cause UE's should be repaired by the main memory hardware where possible and if they cannot be, they should be passed on to the higher level system RAS logic for error handling, such as memory de-allocation, guarding, etc.

Error Handling Overview. In an exemplary embodiment, errors on the memory channel are detected by CRC, reported as poisoned upstream CRC and soft errors will be corrected by a retry operation during the error recovery operation. Two different CRC lengths are used to protect packets on the memory channel from errors. They are CRC-16 on upstream frames (read data to the memory controller) and CRC-18 on downstream frames. The apparent asymmetry of the protection is understood when the additional protection offered by read data ECC is factored in. Hard errors on the channel, primarily caused by interconnect failures (but may also be caused by I/O devices) will be detected by CRC but must be repaired by some other kind of redundancy. In the past, the primary approach has been to employ a symbol-correcting ECC along the bit lane dimension, along with a spare bit lane. An advantage of using ECC is on-the-fly correction of both hard and soft errors. However, once a hard error had occurred, a single error correcting ECC could not correct an additional soft error (a very typical failure mode). Thus, ECC would require a sparing capability anyway in order to move past the first hard error.

Exemplary embodiments of the present invention have a robust retry capability. Every failing memory channel transfer is retried during the error recovery operation. Retry operations that do not complete successfully (e.g., persistent soft error or hard error) will result in a bus repair operation. During the bus repair portion of the error recovery operation, the memory channel is re-initialized (correcting persistent soft errors), tested, and any required spare signal lanes are deployed. Employing spare signal lanes corrects the memory channel hard errors.

Native hub device internal logic errors are detected by various logic error checking mechanisms such as register parity, ECC, or invalid finite state machine (FSM) state detection. Each is reported using the hub device FIR 120. Some of the internal soft errors will be benign and reported for informational purposes, some will be self healing, some will require a memory channel re-initialization to repair, and some will require a full power-on reset. Hard internal errors cannot be repaired without hardware replacement. Memory system RAS policies are used to determine how to handle the internal errors that cannot be repaired without FRU replacement.

In an exemplary embodiment of the present invention, a DDRx registering clock driver (RCD) is utilized for transferring command, control and address signals 204 from the hub device to a DDRx memory device. The RCD receives the command, control and address signals 204 from the memory command interface block 208 in the hub device and forwards them to the DDRx memory device. SDRAM command and address bus errors are detected by parity checking in the RCD. In an exemplary embodiment, the hub device generates the parity signal to the register and the register reports back any detected parity errors on a dedicated error line. The PAR signals drive parity to the RCD and the negative active error signal (errn) returns a parity check from the RCD. In an exemplary embodiment, the command, control, and address signals between the RCD and memory devices are not checked except by the eventual memory controller data ECC checkers.

In an exemplary embodiment, the memory modules 103*a-d* as depicted in FIG. 1 include external thermal sensor(s) with an event output pin. The hub devices 104 also include an internal thermal monitor. The hub device 104 samples the external thermal event pin and an internal thermal monitor and sets FIR bits appropriately.

In an exemplary embodiment, native DRAM ECC is supported by handling all SDRAM ECC check bits as bus data bits transmitted across the channel intact. This allows the host memory controller to appropriately protect the data stored in the SDRAMs, as well as providing an extra measure of protection against data integrity (DI) failures. A DI failure occurs when a catastrophic error overwhelms the CRC or ECC and makes it seems as if no error, or a correctable error, has occurred. Perhaps the most basic example of a bus error of this nature is the case where a bus parity or ECC does not use inverted check bits so that an unplugged cable goes undetected by the system.

In an exemplary embodiment of the present invention, hub device error reporting is done through each hub error detector (channel CRC, DDR3 CA parity, internal logic, thermal, etc.) feeding into one or more FIR bits which enable identification of the error source and the appropriate error recovery mechanism. Error detectors of the same type and severity may be combined into common FIR bit locations.

Error severity. In an exemplary embodiment, FIR bits may be configured to the following reporting severity levels: fault, recoverable, attention, and information. A severity level of fault causes the hub device to activate its fault_n signal, which may lead to a system checkstop. Also, the hub device can be configured to enter a 'clock stop' state that will preserve internal latch contents for diagnostic purposes. Fault severity is utilized if there is imminent threat of customer data integrity issues. The hub device freezes its FIR and "Who's On First" (WOF) bits upon detection of a fault. WOF bits are those configuration and status bits that materially capture the logical state of the hub device at any given instant in time. This enables diagnosis of the failure. However, in an exemplary embodiment, the hub device and the host memory controller are designed with robust, multi-memory channel data ECC such that there are no FIR bit positions set at this level.

A severity level of recoverable indicates that the memory system should initiate error recovery processing. A severity level of attention indicates that attention is requested from the service element. This severity is required if service element intervention is required to recover from an error, log an event, or schedule a future repair action. Failing to correct errors using the error recovery state may lead to this level of error. A severity level of information indicates that all detected errors are recorded in the FIR for informational purposes.

FIR Partitioning. In addition to configurable reporting severity, in an exemplary embodiment the FIR registers are organized into contiguous groups to enable proper error recovery. FIR bits for errors that cause entry into the error recovery state are grouped together. Errors that can cause memory data corruption must enter the error recovery state for on-the-fly retry and repair. The error recovery state is entered by the assertion of any of the error recovery error detectors, not the FIR bits. This way, if the errors are repaired during the error recovery process, the error detectors will be deactivated and recovery completes successfully. The error causing the recovery operation is recorded and reported in the FIR. FIR bits are further organized into groups representing the error effect. FIR bits for errors causing ZEs are in one FIR bit range while those for CEs and UEs are in others. Within these contiguous ranges FIR bits are assigned to enable proper error severity assignment (i.e. fault errors should not be reported with the same FIR bit as an attention error). They are also assigned to enable proper error isolation; errors from dissimilar detectors are assigned to separate FIR bit positions.

Clock Stop. The hub device can be configured to stop its logic clocks when it detects an error at the fault level of severity. Both 'fast' and 'memory preserving slow' clock stop modes are supported. During fast clock stop, the hub device turns off its logic domain clocks immediately upon detection of the fault level error condition. All operations in progress are immediately suspended and memory contents are not preserved. This mode is useful to obtain hub device internal latch contents as close to the time of the error as possible. When the hub device enters the slow clock stop state it takes actions to preserve its internal latch and external SDRAM contents. The hub device will cease decoding new memory commands from the memory controller and disregard any results from commands partially completed. As soon as it is allowed by the DDR3 SDRAM specification, the hub device will issue a "precharge all" command and enter self-timed refresh to all ranks of connected memory. The hub device then activates logical fences and stops the non-vital clock domains. The clock stop state is exited by using the appropriate service interface commands.

Fault_n signal. In an exemplary embodiment, the hub device includes a negative active, bidirectional fault signal referred to herein as "fault_n." In an exemplary embodiment, this signal is dotted across one or more hub devices and connected to a host memory controller signal. Normally, all drivers of the net are in high impedance and a system level pull-up resistor deactivates the fault_n signal. Redundant pull-up resistors are utilized to increase reliability of this important error reporting circuit. When a FIR bit is set in a hub device that is configured at the fault error severity level, the hub device will drive '0' on fault_n, signaling the error. The host memory controller then initiates the proper system response to the indicated fault. The memory controller may also be configured to drive the fault_n signal. The hub device fault_n receiver feeds a dedicated FIR bit position. When unmasked, receiving an active fault_n signal will cause the hub device to enter the fault state, freezing the WOF bits and, if configured, to enter the clock stop state.

Exemplary embodiments of the hub device can detect errors in the following areas: downstream memory channel transmission errors using CRC; upstream memory channel transmission errors using CRC and idle block decodes; secondary upstream clock errors using clock frequency comparison circuits; DDR3 registering clock driver parity errors; internal hub device logic errors; and thermal events and errors. When a non-last hub device in the memory channel detects a secondary upstream (SUS) clock error it sets the appropriate FIR bit, poisons its upstream (US) CRC, enters and drives training state zero (TS0) to the downstream (DS) hub device and enters the error recovery state. As used herein, the term "poisoning the CRC" refers to the technique of artificially changing the CRC check bits such that when checked, the CRC will indicate that an error has occurred.

In an exemplary embodiment, clock error recovery is a complicated process that re-uses the TS0 circuits to affect run-time repairs. Successful recovery relies on detecting a clock error before the outputs of the phase locked loops (PLLs) on the affected hub device have degraded beyond use. When a clock error causes a disruption of the hub device PLL reference clock, the PLL will continue to run and attempt to lock onto the defective input. During this time, the clock error will be detected and the TS0 repair process must be entered. The hub device places its SDRAM chips into suspend to RAM (STR) mode and enters the error recovery state (ERS) before its internal clocks become unusable.

DDR3 RCD CA parity error detection. When enabled, the hub device samples the DDR3 registering clock driver parity error signals on each memory clock cycle. When the hub device detects a DDR3 command and address parity error it sets the appropriate FIR bit, poisons its US CRC, and enters the error recovery state.

Internal hub device logic error detection. Hub device internal logic blocks that may cause memory data corruption due to hard or soft internal errors include error detection logic. Other logic blocks, (used for diagnostics, self test, etc.) may also include error detection logic and if they do, they enable appropriate error severity (e.g., masking). Each internal error detector is assigned to the appropriate FIR bit partition.

The vast majority of soft internal logic errors are repairable without service element intervention (such as power-on reset, scan flush or re-configuration). Many soft errors are repaired simply by performing the memory channel re-initialization and repair procedure during error recovery. Soft errors that will not be repaired by this process include self-healing logic such as ECC and automatic re-load.

Hard errors are those that require replacement hardware to repair. While some external error types have spare logic, exemplary embodiments of the hub device internal error types do not include this capability.

When the hub device detects an internal logic error it sets the appropriate FIR bit at the informational severity. Errors that will result in uncorrectable data errors will also cause the hub device to enter the error recovery state.

Thermal Error Detection. In an exemplary embodiment, the hub device includes both an internal temperature monitor and support for two external thermal monitor event signals. The internal monitor includes a temperature sensor macro along with a logic block with two configurable thresholds. The higher limit, called the safety limit, sets a FIR bit at attention level when a high temperature is detected. The lower limit, called the throttling limit, sets a FIR bit at attention level when a reduction in junction temperature is required to reduce data error likelihood. When enabled by mask bits, the external monitors set FIR bits at attention level when they sample an active m[ab]_eventn pin from the DDR3 memory system. When the hub device detects a thermal error it sets the appropriate FIR bit at attention level but otherwise continues normal operation.

Figure 3:
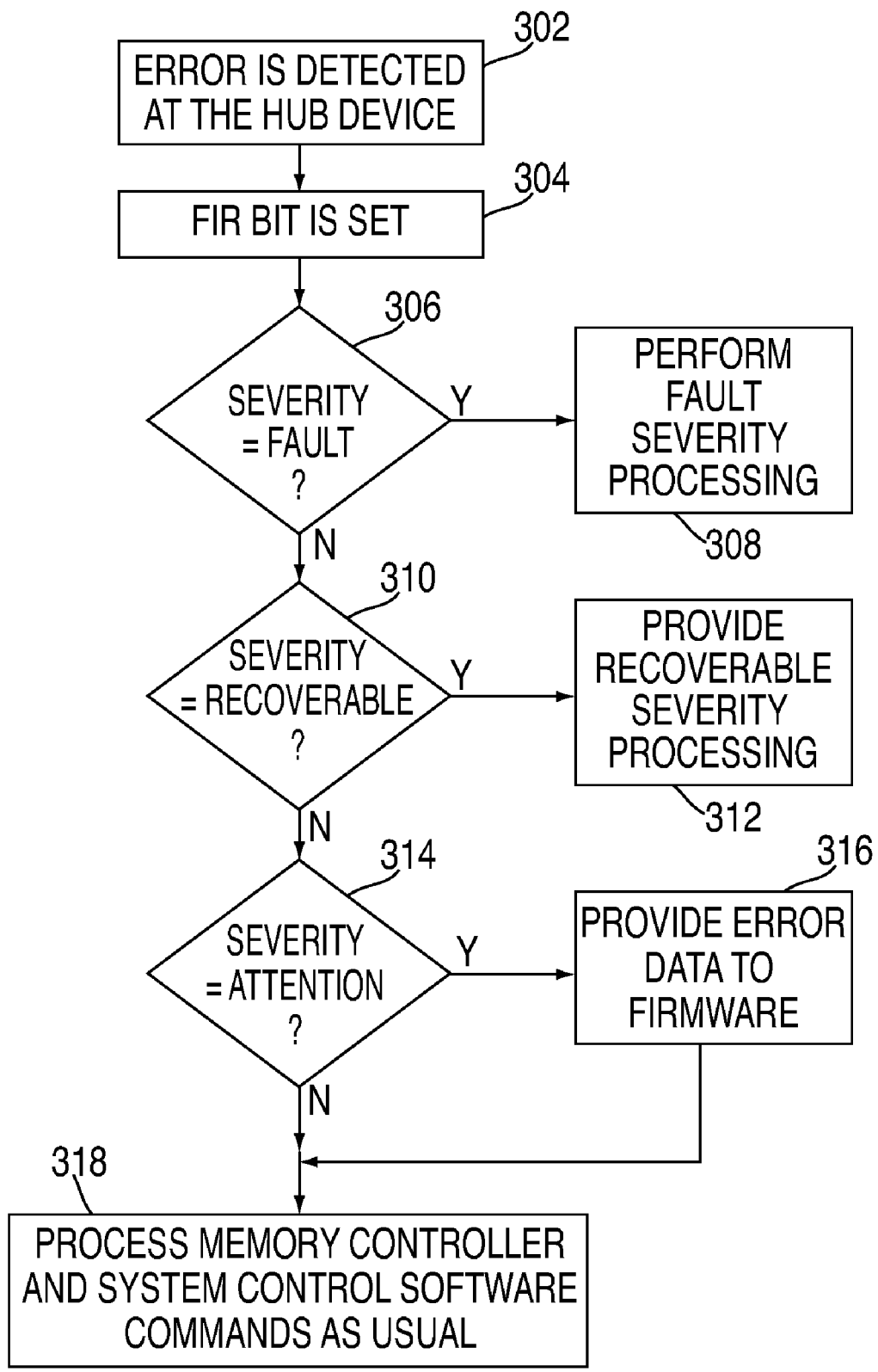
FIG. 3 depicts a hub device error detection process flow that may be implemented by an exemplary embodiment.

FIG. 3 depicts a hub device error detection scenario process flow that may be implemented by an exemplary embodiment of the present invention. At block 302, an error is detected at the hub device and at block 304, a FIR bit is set to indicate a level of severity of the detected error. At block 306, it is determined if the severity is "fault". If the severity is fault then processing continues at block 308 to perform fault severity processing which includes asserting fences to suspend operations at the hub device. An exemplary embodiment of fault severity processing at the hub device is depicted in FIG. 5 and described herein below. If the severity is not fault then processing continues to block 310 to determine if the severity is "recoverable". If the severity is recoverable then processing continues at block 312 to perform recoverable severity processing which includes preparing the hub device for receiving a retry instruction from the memory controller. An exemplary embodiment of recoverable severity processing at the hub device is depicted in FIG. 4 and described herein below.

If the severity is not recoverable, as determined at block 310, the processing continues to block 314 to determine if the severity is "attention". If the severity is attention, then processing continues at block 316 to provide error data to firmware in the hub device and/or memory controller (e.g., to notify). Processing then continues at block 318. If the severity is not recoverable, then it is assumed to be "informational" and processing continues at block 318 after the hub device and/or memory controller have been notified. At block 318, the hub device continues to process memory controller and system control software commands.

Figure 4:
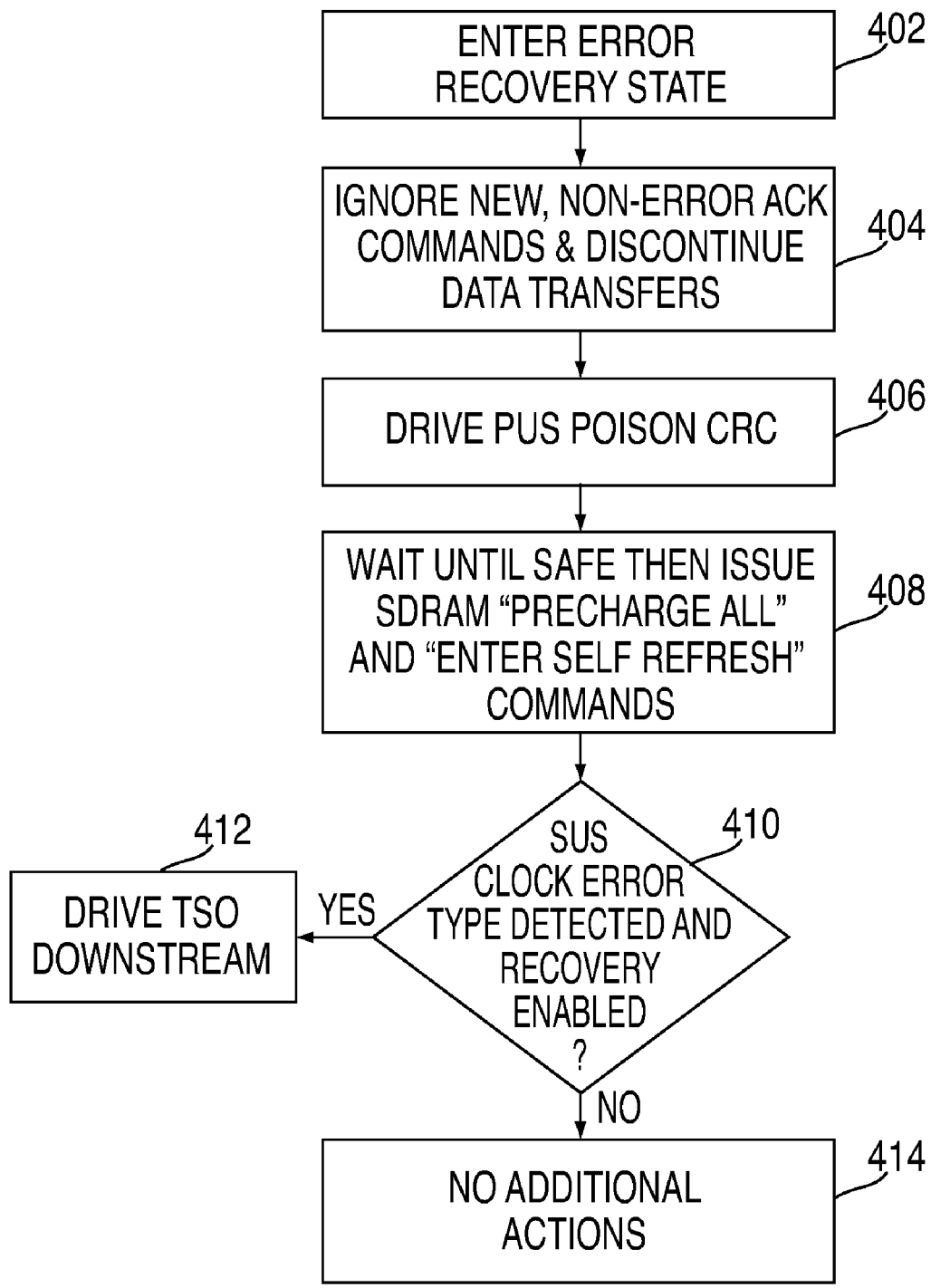
FIG. 4 depicts hub device recoverable error severity processing that may be implemented by an exemplary embodiment.

FIG. 4 depicts hub device recoverable error severity processing that may be implemented by an exemplary embodiment of the present invention. This process is invoked when the error is determined to be "recoverable" (e.g., based on contents of one or more FIR bits). At block 402, the error recovery state is entered. At block 404, new, non-error ack commands (e.g., commands that don't require an acknowledgement or response) are ignored and data transfers are discontinued. Thus, new commands are ignored and an attempt is made to preserve the DRAM data. At block 406, the hub device drives poisoned CRC on the primary upstream (PUS) bus to the memory controller to report the error to the memory controller. In response to receiving the poisoned CRC, the memory controller attempts error recovery as described below in reference to FIG. 6. At block 408, the hub device waits until it is safe (e.g., when all DRAMs have completed the commands they are currently executing and are ready to receive a new command) and then issues SDRAM "precharge all" and "enter self-refresh" commands to all ranks of memory devices attached to the hub device. At block 410, it is determined if a secondary upstream (SUS) clock error has been detected and if recovery has been enabled (e.g., if the hub device is not the last hub device in the channel). If a SUS clock error has been detected and recovery has been enabled, then block 412 is performed to set a FIR bit, to drive training state 0 (TS0) to downstream hub devices, and to enter the recovery state. Thus, upon detecting a SUS clock error, the hub device initiates clock error recovery for downstream hub devices while waiting for instructions from the memory controller. If a SUS clock error has not been detected and/or recovery has not been enabled, then block 414 is performed and no additional actions are performed while waiting for instruction from the memory controller.

In an exemplary embodiment, the training states are numbered sequentially from TS0 to TS7. TS0 performs clock detection and repair training, test and repair (if required). TS1 performs static configuration and calibration training, test and repair (if required). TS2 performs downstream lane training, test and repair (if required). TS3 performs upstream lane training, test and repair (if required). TS4 performs packet training (de-skew), test and repair (if required). TS5 performs initiate valid packets (block load) training, test and repair (if required). TS6 performs frame lock (DRAM clock sync) training, test and repair (if required). TS7 performs read data latency and inter-channel de-skew training, test and repair (if required).

FIG. 5 depicts hub device fault error severity processing that may be implemented by an exemplary embodiment of the present invention. This process is invoked when the error is determined to be "fault" (e.g., based on contents of one or more FIR bits). At block 502, the error is signaled to the memory controller by driving the fault_n signal. At block 504 it is determined if slow clock mode is enabled. Slow clock mode causes the commands and data to be received on memory channel at a reduced clock rate. Slow clock mode allows the interface to support communications before it is initialized and trained for normal, high speed operation. If slow clock mode is enabled, then actions are performed to preserve internal latches and memory device contents. Processing continues at block 506 where new commands are ignored and data transfers are discontinued. Next, block 508 is performed and the hub device waits until it is safe and then issues SDRAM "precharge all" and "enter self-refresh" commands to all ranks of memory devices attached to the hub device. Processing then continues at block 510 where logical fences are asserted and non-vital clock domains are turned off.

If it is determined, at block 504, that slow clock mode is not enabled, then processing continues at block 512 where it is determined if fast clock mode is enabled. Fast clock mode is the normal operation of a high-speed bus. If fast clock mode is enabled then processing continues at 514 where fences are asserted and the logic domain clocks are turned off. Thus, all operations in process are immediately suspended and memory device contents are not preserved. If it is determined, at block 512, that fast clock mode is not enabled, the processing continues at block 516 where no additional actions are taken.

FIG. 6 depicts a memory controller error recovery operation that may be implemented by an exemplary embodiment of the present invention. At block 602, the memory controller detects a CRC error or a poisoned idle which causes the memory controller to enter an error recovery state. At block 604, it is determined if the unsuccessful re-initialization threshold has been exceeded. If it has, then block 606 is performed and the memory channel or memory port is de-allocated as appropriate. Exceeding this threshold signifies that the memory can not be repaired. If it is determined, at block 604, that the unsuccessful re-initialization threshold has not been exceeded, then block 608 is performed and it is determined if the successful re-initialization threshold has been exceeded. If it has been exceeded, then processing continues at block 610 and the lane shadowing procedure is started. Exceeding the successful re-initialization threshold signifies that a lane is starting to go bad and that the memory controller should prepare to swap out the lane if needed.

If it is determined, at block 608, that the successful re-initialization threshold has not been exceeded, then processing continues at block 612 where it is determined if the retry threshold has been exceeded. If the retry threshold has been exceeded, then processing continues at block 614 to start channel re-initialization and repair (e.g., swap out the bad lane). At block 616, it is determined if clock recovery is enabled. If clock recovery is enabled, then block 618 is performed and the memory controller initiates the re-initialization and repair on the memory system starting with TS0. The memory controller drives each training state through the memory system (skipping TS1 in an exemplary embodiment). Once TS0, and TS2 through TS7 have been completed, processing continues at block 620. If clock recovery is not enabled, as determined at block 616, then block 624 is performed to determine if fast re-init is enabled. If fast re-init is enabled, then it is assumed that the interface is healthy and block 626 is performed to start the re-initialization and repair in training state TS2. Once TS0, and TS2 through TS7 have been completed, processing continues at block 620.

If fast re-init is not enabled, as determined at block 624, then block 628 is performed and the memory controller starts the re-initialization and repair in training state TS0. Once TS0, and TS2 through TS7 have been completed, processing continues at block 620. At block 620, the memory controller exits the self-timed refresh mode and at block 622, the suspect command sequence is retried.

If it is determined, at block 612, that no error thresholds have been exceeded, block 630 is performed to report the error. Blocks 620 and 622 are then performed to exit the self-timed refresh mode and to retry the command sequence.

FIG. 7 is a table indicating expected results from various error recovery scenarios that may be implemented by an exemplary embodiment of the present invention. This is one example implementation and others are possible depending on installation requirements.

Error Injection. The hub device enables both hard and soft errors to be injected on its upstream and downstream memory channel transmitters. In an exemplary embodiment, the hub device also provides periodic error injection on these signals: SDRAM read data; SDRAM command and address outputs; and internal error detectors. Soft errors will invert the intended bit(s) for one single bus transfer. Hard errors will invert selected bit(s) continuously until disabled. Periodic error injection includes configurable error rates that enable testing of RAS features, such as lane shadowing, that are targeted at non-hard errors with a greater than normal bit error rate (BER). Error injection uses configurable error injection masks that select which bits to invert. "1's" in the error mask indicate the bit to invert during error injection. "0's" in the mask locations indicate which bits will not be inverted.

Memory Channel Error Injection. In an exemplary embodiment, error injection on the memory channel is accomplished on the driver side data by inverting one of the four transfers of a channel block. This will generate a single "flipped" bit on the bus, for one bit time. Each hub device transmitter, SDS and PUS, has a 15 or 22 bit register which determines which lane(s) will have errors injected. They also have a control register that selects an error injection rate. In an exemplary embodiment, the error injection rate is selectable between 14 different periodic rates, a single instance of error injection or zero (no error injection). The 14 selectable error rates each vary from each other by a factor of eight, giving a binary error inject rate varying from once every 4 bit times to once every $2^{43}$ bit times, which equates roughly to a 10E-13 bit error rate. The slower inject rates may be useful for generating CRC error rates in functional mode to check the protocol's retry capabilities, and to force the MC protocol to perform a re-initialization. The faster error inject rates, in the less-than 1000 UI range, are handy for simulating "bad" lanes during alignment. A bit error rate of faster than one error per 1024 UI will cause the bit lock detector to mark the lane as bad. Setting different bits to have error injected will also allow testing of all the lane repair logic. Zero, one, or two lanes having errors injected will test the repair capabilities, and more than two lanes will cause un-repairable, fatal alignment errors. To cause a single error injection, the error inject rate control can be toggled between the 0000 and 0001 setting. Each transition from 0000 to 0001 will cause a single error injection.

Internal Errors. In an exemplary embodiment, internal error detection supports limited error injection. Temporary soft errors can be injected in all error detector groups by writing a '1' to the appropriate FIR register. During the recovery process, this bit should be cleared and no additional errors should be detected. To inject persistent soft and hard errors an additional capability is required. Each of the FIR severity types, (ZE, CE and UE) includes a single bit error injector that can be configured to report a persistent soft or hard error. When a soft error is injected, the injected error will be cleared by the re-initialization and repair steps of the error recovery process. It will not be cleared by the retry portion. When a hard error is injected, it will not be cleared until the error mask is overwritten by a configuration register write operation.

Error Trapping. In an exemplary embodiment, the hub device contains trace array registers that can be configured to trap the first or most recent upstream and downstream frames with CRC errors. This enables identification of the failing bit(s) using a post-processing routine that compares the expected bits to the detected bits. This capability greatly enhances memory channel debug and characterization capabilities. Other detected errors are recorded in the previously described FIR.

Figure 8:
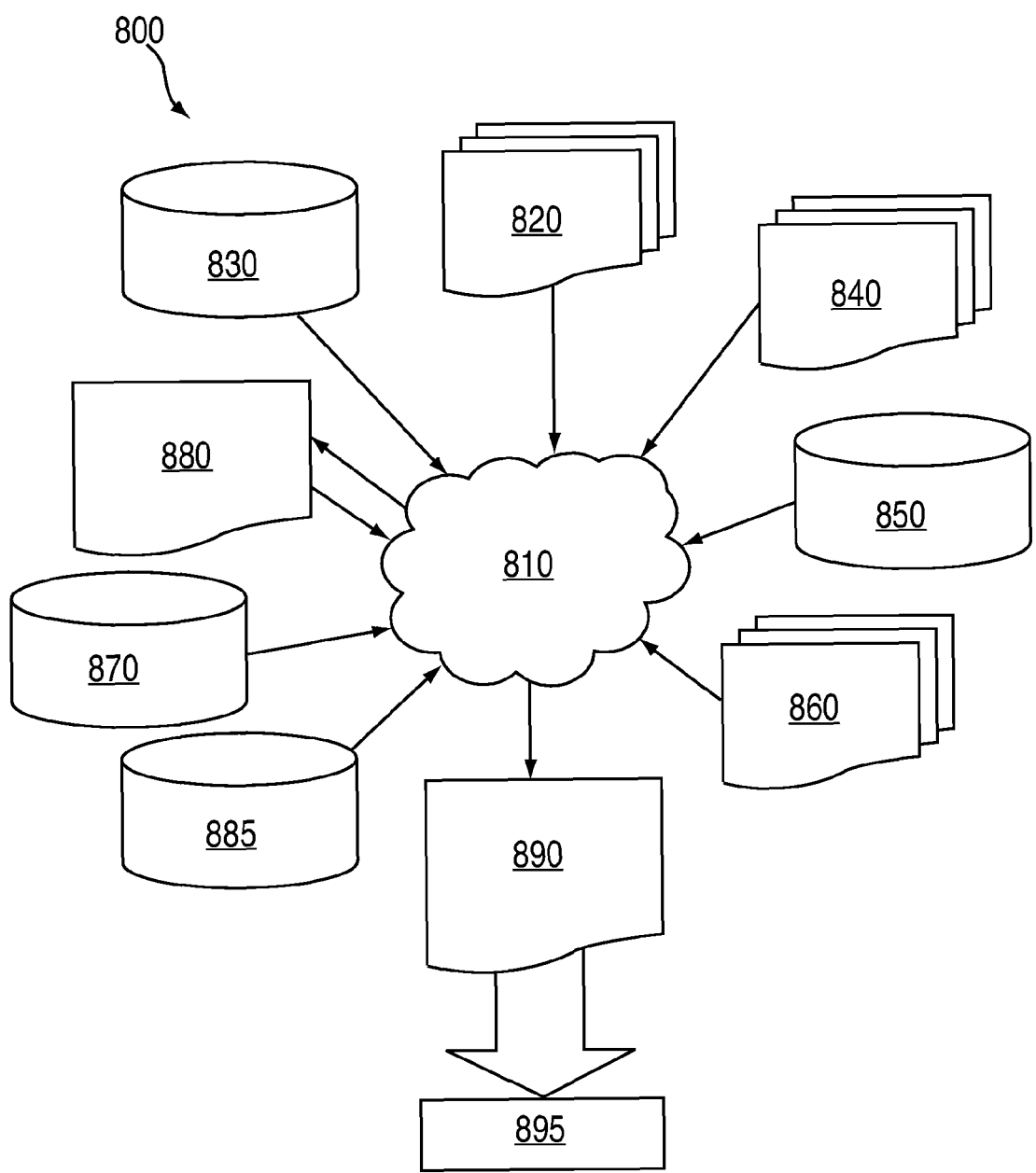
FIG. 8 shows a block diagram of a design flow that may be implemented by an exemplary embodiment of the present invention.

FIG. 8 shows a block diagram of an exemplary design flow 800 used for example, in semiconductor IC logic design, simulation, test, layout, and manufacture. Design flow 800 includes processes and mechanisms for processing design structures or devices to generate logically or otherwise functionally equivalent representations of the design structures and/or devices described above and shown in FIG. 2. The design structures processed and/or generated by design flow 800 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 1-7. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 1-7 to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 890 may comprise a compiled, executable HDL simulation model that functionally simulates the devices shown in FIGS. 1-7.

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2. Design structure 890 may then proceed to a stage 895 where, for example, design structure 890: proceeds to tape-out, is released to manufacturing, is released to a mask house, is sent to another design house, is sent back to the customer, etc.

Non-last hub devices in the memory channel must monitor frames received from a downstream hub device on an upstream bus to properly detect and forward poisoned CRC. When the hub device detects an upstream CRC error it interrupts all read traffic in progress, forwards the poisoned CRC, sets the appropriate FIR bit and enters the error recovery state.

In an exemplary embodiment, hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(es) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refer to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including soldered interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices.

Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency(ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated with the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency(ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the usable frequency, operating margins and related attributes within the cost, space, power and other constraints.

Technical effects and benefits include providing the effectiveness of an ECC solution with the efficiency of a CRC solution. In response to detecting an error, an error severity bit is set. The severity of the error is utilized to determine what action should be taken (e.g., fence, retry or notify). These improvements in error and detection and correction may lead to improvements in RAS.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, it will be understood that the use of the terms first, second, etc. do not denote any order or importance, but rather the terms first, second, etc. are used to distinguish one element from another.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A hub device comprising:
an interface to a high speed bus for communicating with a memory controller, the memory controller and the hub device included in a cascade interconnect memory system and the high-speed bus including bit lanes and one or more clock lanes;
a bi-directional fault signal line in communication with the memory controller and readable by a service interface;
a fault isolation register (FIR) for storing information about failures detected at the hub device, the information including severity levels of the detected failures; and
error recovery logic for responding to a failure detected at the hub device, the responding including:
recording a severity level of the failure in the FIR; and
taking an action at the hub device that is responsive to the severity level of the failure, the action including one or more of fast clock stop, setting the bi-directional fault indicator, setting cyclical redundancy code (CRC) bits and transmitting them to the memory controller, re-try, sparing out a bit lane and sparing out a clock lane,
wherein the severity level is fault and the hub device notifies the memory controller of the failure via the fault signal line, preserves contents of internal latches and memory devices in response to the hub device operating in a slow clock mode, asserts fences and turns off logical clocks.

2. The hub device of claim 1 wherein the failure is one or both of an uncorrectable error and a hard error.

3. The hub device of claim 1 wherein the severity level is recoverable and the hub device notifies the memory controller of the failure by transmitting a poisoned CRC to the memory controller via the high speed bus and preserves contents of internal latches and memory devices.

4. The hub device of claim 3 wherein the hub device is in communication with a downstream hub device via the high speed bus and the hub device further initiates a clock repair and detection training state on the downstream hub device in response to the failure occurring in a clock received from the downstream hub device.

5. The hub device of claim 3 wherein the failure is one or both of a correctable error and a persistent soft error.

6. The hub device of claim 1 wherein the severity level is attention and the hub device records the failure and notifies the memory controller of the failure.

7. The hub device of claim 6 wherein the failure is one or more of a zero error and a temporary soft error.

8. The hub device of claim 1 wherein the severity level is information and the hub device records the failure at the hub device and notifies the memory controller of the failure.

9. The hub device of claim 1 wherein the failure is one or more of a clock error, an internal hub device logic error, a channel error, and a thermal error.

10. A high reliability cascade interconnect memory system comprising:
a memory controller;
a unidirectional downstream channel including multiple bit lanes and clock lanes, the downstream channel in communication with the memory controller and operable for transferring data frames comprised of eight, twelve or sixteen transfers;
a unidirectional upstream channel including multiple bit lanes and clock lanes, the downstream channel in communication with the memory controller and operable for transferring data frames comprised of eight transfers; and
a hub device in communication with a plurality of memory devices and in communication with both the downstream and upstream channels for communicating with the memory controller via direct connection or via a cascade interconnection through an other hub device, the hub device comprising:
a bi-directional fault signal line in communication with the memory controller and readable by a service interface;
a fault isolation register (FIR) for storing information about failures detected at the hub device, the information including severity levels of the detected failures; and
error recovery logic for responding to a failure detected at the hub device, the responding including:
recording a severity level of the failure in the FIR; and
taking an action at the hub device that is responsive to the severity level of the failure, the action including one or more of fast clock stop, setting the bi-directional fault indicator, setting cyclical redundancy code (CRC) bits and transmitting them to the memory controller, re-try, sparing out a bit lane and sparing out a clock lane,
wherein the severity level is fault and the hub device notifies the memory controller of the failure via the fault signal line, preserves contents of internal latches and memory devices in response to the hub device operating in a slow clock mode, asserts fences and turns off logical clocks.

11. The memory system of claim 10 wherein the hub device notifies the memory controller of the failure and the memory controller responds to the notification by de-allocating all or portions of the memory system, by entering a lane shadowing procedure, by performing re-initialization and repair of all or portions of the memory system or by initiating a retry of a command sequence.

12. The memory system of claim 10 wherein the severity level is recoverable and the hub device notifies the memory controller of the failure by transmitting a poisoned CRC to the memory controller via the high speed bus and preserves contents of internal latches and memory devices.

13. The memory system of claim 12 wherein the hub device further initiates a clock repair and detection training state on the downstream hub device in response to the failure occurring in a clock received from the downstream hub device.

14. The memory system of claim 10 wherein the severity level is attention or information and the hub device records the failure and notifies the memory controller of the failure.

15. A method for processing errors in a memory system, the method comprising:

detecting a failure having a severity level at a hub device in a cascade interconnect memory system, the memory system including the hub device and a memory controller;
recording the severity level in a FIR at the hub device;
notifying the memory controller of the failure via a fault signal line, preserving contents of internal latches and memory devices in response to the hub device operating in a slow clock mode, and asserting fences and turning off logical clocks at the hub device in response to the severity level indicating that the failure is a fault;
notifying the memory controller of the failure by transmitting a poisoned cyclical redundancy code (CRC) to the memory controller, and preserving contents of internal latches and memory devices in response to the severity level indicating that the failure is recoverable; and
recording the failure at the memory device in response to the severity level indicating that the failure is other than a fault or recoverable.

16. The method of claim 15 wherein the hub device is in communication with a downstream hub device and a clock repair and detection training state is initiated on the downstream hub device in response to the failure occurring in a clock received from the downstream hub device and to the severity level indicating that the failure is recoverable.

17. The method of claim 15 wherein the failure is one or more of a clock error, a channel error, an internal hub device logic error, and a thermal error.

18. A design structure tangibly embodied in a machine readable medium for designing, manufacturing, or testing an integrated circuit, the design structure comprising:
a hub device comprising:
an interface to a high speed bus for communicating with a memory controller, the memory controller and the hub device included in a cascade interconnect memory system and the high-speed bus including bit lanes and one or more clock lanes;
a bi-directional fault signal line in communication with the memory controller and readable by a service interface;
a fault isolation register (FIR) for storing information about failures detected at the hub device, the information including severity levels of the detected failures; and
error recovery logic for responding to a failure detected at the hub device, the responding including:
recording a severity level of the failure in the FIR; and
taking an action at the hub device that is responsive to the severity level of the failure, the action including one or more of fast clock stop, setting the bi-directional fault indicator, setting cyclical redundancy code (CRC) bits and transmitting them to the memory controller, re-try, sparing out a bit lane and sparing out a clock lane,
wherein the severity level is fault and the hub device notifies the memory controller of the failure via the fault signal line, preserves contents of internal latches and memory devices in response to the hub device operating in a slow clock mode, asserts fences and turns off logical clocks.

* * * * *